(12) United States Patent
Suzuki et al.

(10) Patent No.: US 7,883,746 B2
(45) Date of Patent: Feb. 8, 2011

(54) INSULATING FILM FORMATION METHOD WHICH EXHIBITS IMPROVED THICKNESS UNIFORMITY AND IMPROVED COMPOSITION UNIFORMITY

(75) Inventors: Jun Suzuki, Kyoto (JP); Kenji Yoneda, Kyoto (JP); Seiji Matsuyama, Hyogo (JP)

(73) Assignee: Panasonic Corporation, Osaka (JP)

( * ) Notice: Subject to any disclaimer, the term of this patent is extended or adjusted under 35 U.S.C. 154(b) by 817 days.

(21) Appl. No.: 11/826,495

(22) Filed: Jul. 16, 2007

(65) Prior Publication Data

US 2008/0026251 A1    Jan. 31, 2008

(30) Foreign Application Priority Data

Jul. 27, 2006    (JP) .............................. 2006-205118

(51) Int. Cl.
*C23C 16/40*    (2006.01)
(52) U.S. Cl. ............... 427/255.29; 427/255.31; 117/88; 117/89
(58) Field of Classification Search ............ 427/255.29, 427/255.31; 117/88, 89
See application file for complete search history.

(56) References Cited

U.S. PATENT DOCUMENTS

2003/0031807 A1* 2/2003 Elers et al. ............... 427/569
2005/0183664 A1* 8/2005 Hwang et al. ............. 118/715
2006/0045968 A1* 3/2006 Metz et al. ............... 427/248.1
2007/0031598 A1* 2/2007 Okuyama et al. ......... 427/248.1

FOREIGN PATENT DOCUMENTS

JP    2004-165668    6/2004
JP    2006-66557     3/2006

OTHER PUBLICATIONS

Sneh, Ofer, et al., "Thin film atomic layer deposition equipment for semiconductor processing". Thin Solid Films 402 (2002) pp. 248-261.*
Kukli, Kaupo, et al., "Atomic Layer Deposition of Hafnium Dioxide Films from 1-Methoxy-2-methyl-2-propanolate Complex of Hafnium". Chem. Mater. 2003, 15, pp. 1722-1727.*

* cited by examiner

*Primary Examiner*—Bret Chen
(74) *Attorney, Agent, or Firm*—McDermott Will & Emery LLP (57) ABSTRACT

In an insulating film formation method, a cycle A in which $O_3$ at a low flow rate is supplied onto a substrate and then $O_3$ supplied is allowed to react with Hf on the substrate in a non-equilibrium state to form a hafnium oxide film is carried out M times (M≧1), and a cycle B in which $O_3$ at a high flow rate is supplied onto the substrate and then $O_3$ supplied is allowed to react with Hf on the substrate in an equilibrium state to form a hafnium oxide film is carried out N times (N≧1). These insulating film formation cycles are defined as one sequence. This sequence is repeated until a desired thickness is obtained, thereby forming a target insulating film.

16 Claims, 6 Drawing Sheets

INSULATING FILM FORMATION METHOD WHICH EXHIBITS IMPROVED THICKNESS UNIFORMITY AND IMPROVED COMPOSITION UNIFORMITY

BACKGROUND OF THE INVENTION (a) Fields of the Invention

The present invention relates to insulating film formation methods employed for semiconductor devices, semiconductor devices, and substrate processing apparatus.

(b) Description of Related Art

In recent years, the wafer size of a semiconductor substrate has been enlarged and a semiconductor element design has become finer. With such trend, decreasing variations in processing dimensions among apparatus for mass production becomes important in order to improve the fabrication yield thereof. In particular, since the thickness uniformity of a gate insulating film or a capacitor insulating film affects variations in the characteristics of a device using this insulating film, it is desirable that the thickness uniformity of the insulating film, such as the uniformity within a wafer, the wafer-to-wafer uniformity, and the process-to-process uniformity, be good.

Since a device with a design rule of 100 nm or smaller is required to have an excellent thickness uniformity, a film formation made by an ALD (Atomic Layer Deposition) method, which is one of CVD (Chemical Vapor Deposition) methods, is employed. The ALD method is a film formation method carried out in the manner in which under a given film-formation condition (temperature and pressure), at least two or more types of material gases are supplied onto a wafer alternately, one type at a time, and resulting surface reaction thereon alone allows atoms of each type to adsorb by a single atomic layer (see, for example, Japanese Unexamined Patent Publication No. 2004-165668).

In the ALD method, however, a single atomic layer is formed on the wafer at a time, so that, for example, the processing time becomes longer. From such a fact, it is difficult for this method to respond to mass production of the device. To address this problem, a wafer processing apparatus called a vertical batch processing apparatus is developed within which 25 or more wafers each lie horizontally and are axially aligned within a reaction tube (see, for example, Japanese Unexamined Patent Publication No. 2006-66557).

SUMMARY OF THE INVENTION

However, in the vertical batch processing apparatus, many wafers are processed at a time. This causes the problem that the difference in the insulating film thickness occurs or the film compositions of the insulating films vary between wafers disposed in an upper area and a lower area of the reaction tube.

The present invention has been made to solve the problems described above, and its object is to provide an insulating film formation method and a substrate processing apparatus by which an insulating film with a good thickness uniformity as well as a good film composition uniformity can be formed in forming the film by an ALD method with a vertical batch processing apparatus.

To attain the above object, an insulating film formation method according to the present invention includes: the step (a) of supplying a first material gas onto a plurality of substrates aligned at given intervals within a chamber of a substrate processing apparatus in the perpendicular direction of the chamber, thereby forming an atomic layer on each of the plurality of substrates; the step (b) of supplying, after the step (a), a first supply amount of a second material gas onto the plurality of substrates to allow the second material gas to react with the atomic layer on each of the substrates in a non-equilibrium state, thereby forming an insulating film; and the step (c) of supplying, after the step (a), a second supply amount of the second material gas onto the plurality of the substrates to allow the second material gas to react with the atomic layer in an equilibrium state, thereby forming an insulating film, and in this method, an insulating film formation cycle is repeated which is defined so that the steps (a) and (b) are repeatedly carried out alternately M ($1 \leq M$) times and then the steps (a) and (c) are repeatedly carried out alternately N ($1 \leq N$) times. Preferably, the first supply amount is smaller than the second supply amount.

With this method, in the step (b), a reaction with the atomic layer formed on the substrate in the step (a) is caused in a non-equilibrium state. Thereby, the second material gas can be prevented from flowing in the form of a turbulent flow, and the second material gas in the form of a laminar flow can be supplied to form an insulating film. As a result of this, the insulating film with an excellent thickness uniformity can be formed. Moreover, in the step (c), a reaction with the atomic layer formed on the substrate in the step (a) is caused in an equilibrium state. Thereby, variations in the composition of the insulating film within the substrate can be reduced which are feared in the reaction proceeding in a non-equilibrium state, so that an insulating film with an excellent film composition uniformity can be formed. With the insulating film formation method according to the present invention, the insulating film formation cycles described above are used as one sequence and this sequence is repeated until a desired thickness is obtained. Thereby, the insulating film with an excellent thickness uniformity as well as an excellent film composition uniformity within the substrate can be formed.

Preferably, in the insulating film formation method according to the present invention, the step (b) further includes: the substep of supplying, before supply of the second material gas, an inert gas into the chamber to exhaust the first material gas remaining within the chamber; and the substep of supplying, after formation of the insulating film, an inert gas into the chamber to exhaust the second material gas remaining within the chamber, and the step (c) further includes: the substep of supplying, before supply of the second material gas, an inert gas into the chamber to exhaust the first material gas remaining within the chamber; and the substep of supplying, after formation of the insulating film, an inert gas into the chamber to exhaust the second material gas remaining within the chamber. With this method, since an inert gas is supplied to exhaust the gas remaining within the chamber, the reaction of the material gas with the atomic layer formed on the substrate can be caused further efficiently.

Preferably, in the insulating film formation method according to the present invention, the insulating film is made of an oxide of metal, and the metal includes any selected from group-III elements, group-IV elements, and group-V elements.

Preferably, the first material gas includes any of lanthanoid, actinoid, aluminum, zirconium, hafnium, and tantalum, and the second material gas includes ozone.

Preferably, the insulating film is made of silicon nitride. In this case, preferably, the first material gas includes a silicon chloride-based material or a silicon organic chloride-based material, and the second material gas includes ammonia.

Preferably, the insulating film is made of silicon oxide. In this case, preferably, the first material gas includes a silicon chloride-based material or a silicon organic chloride-based material, and the second material gas includes ozone.

Preferably, in the insulating film formation method according to the present invention, a first nozzle of a straight tube shape having a gas supply orifice formed at a top portion of the chamber and a second nozzle having holes formed at multiple locations in a vertical direction, respectively, are included, in the step (a), the first material gas is supplied from the first nozzle, and in the steps (b) and (c), the second material gas is supplied from the second nozzle. In this case, preferably, the first material gas is a gas more highly reactive than the second material gas. Preferably, the second material gas has a smaller molecular weight than the first material gas.

With this method, in the case where the first material gas is more highly reactive than the second material gas, the first material gas is supplied from the gas supply orifice of the first nozzle in the step (a) to pass the gas onto the substrate in the form of a laminar flow. Therefore, variations in the flow rate of the gas supplied onto the substrates can be reduced to provide an insulating film with a good thickness uniformity within the substrate. Moreover, the first material gas can be supplied from the first nozzle to suppress the occurrence of particles as reaction products. Also, the second material gas with a smaller supply amount than the second supply amount can be supplied in the step (b) to suppress the reaction on the substrates disposed at the top portion of the chamber. Therefore, an insulating film even with an excellent substrate-to-substrate thickness uniformity can be formed. Furthermore, the second material gas with a greater supply amount than the first supply amount can be supplied in the step (c) to eliminate potential substrate-to-substrate variations in film compositions occurring in the previous step (b). Therefore, an insulating film even with an excellent substrate-to-substrate film composition uniformity can be formed.

A semiconductor device according to the present invention includes a hafnium oxide film formed by the insulating film formation method according to the present invention so that the first supply amount is made smaller than the second supply amount, and the oxygen/hafnium content in the hafnium oxide film is 2.1 or higher. The hafnium oxide film provided in the semiconductor device according to the present invention is formed by the insulating film formation method according to the present invention, and has a higher oxygen/hafnium content than, for example, the oxygen/hafnium content of a hafnium oxide film (2.0) formed by a sputtering method. Thus, the formed insulating film exhibits a high dielectric constant. Therefore, with the semiconductor device of the present invention including the above-described hafnium oxide film as, for example, a capacitor insulating film, a semiconductor device with an increased capacitance can be provided.

A substrate processing apparatus according to the present invention includes: a chamber for forming, using a first material gas and a second material gas, an insulating film on each of a plurality of substrates; a wafer boat for mounting the plurality of substrates within the chamber to be aligned at given intervals in the perpendicular direction of the chamber; a first nozzle extending from bottom to top along an inner wall of the chamber and formed, at a top portion of the chamber, with a gas supply orifice for supplying the first material gas onto the plurality of substrates; and a second nozzle extending from bottom to top along the inner wall of the chamber and formed with a plurality of holes for supplying the second material gas onto the plurality of substrates, the holes being provided in the vertical direction.

With the substrate processing apparatus, the first material gas more highly reactive than the second material gas is supplied from the first nozzle. Then, the highly reactive first material gas supplied flows onto each of the substrates in the form of a laminar flow. Therefore, variations in the flow rate of the first material gas supplied onto the substrate can be reduced to provide an insulating film with a good thickness uniformity. Moreover, the first nozzle can have a gas supply orifice with an increased diameter as compared with the holes formed in the second nozzle. Therefore, even in the case where a gas more highly reactive than the second material gas is used as the first material gas, the occurrence of particles as reaction products can be suppressed. This prevents the particles blown up by a turbulent flow from adhering onto the substrates and the like. As a result of this, the substrate processing apparatus according to the present invention can form an insulating film with a good thickness uniformity and a good film composition uniformity within the substrate.

Preferably, in the substrate processing apparatus according to the present invention, each of the plurality of holes is arranged in shifted relation to the same direction as the direction of rotation of the wafer boat so that the angle formed between: a straight line connecting the central axis of the second nozzle on a cut surface thereof in parallel with the principal plane of the substrate and the central axis of the substrates; and a straight line connecting the central axis of the second nozzle and the center of each said hole ranges from 5° to 90° inclusive. This enables supply of the second material gas even onto the center portion of the substrate, so that film thickness variations within the substrate such that the film thickness is greater at the edge portion of the substrate and smaller at the center portion thereof can be reduced to provide an insulating film with an excellent thickness uniformity within the substrate.

As described above, the insulating film formation method and the substrate processing apparatus of the present invention are useful in forming, for example, a gate insulating film or a capacitor insulating film used in a semiconductor device such as a DRAM.

DETAILED DESCRIPTION OF THE PREFERRED EMBODIMENTS

First Embodiment

An insulating film formation method according to a first embodiment of the present invention will be described below with reference to the accompanying drawings. This description will be made exemplarily using formation of a capacitor insulating film made of a hafnium oxide film.

Figure 1:
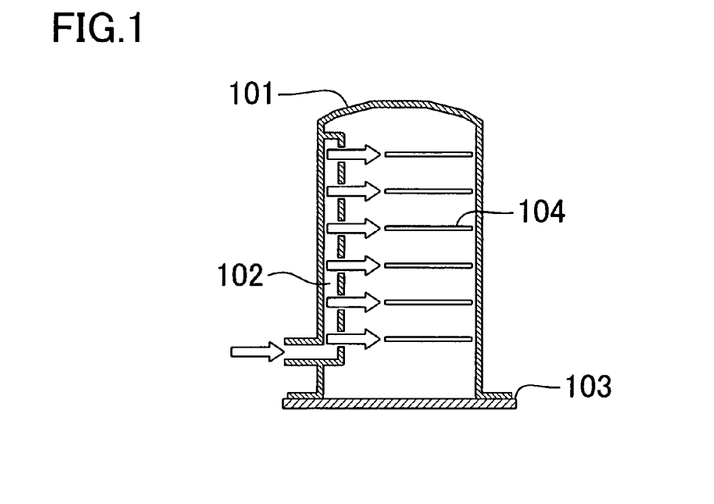
FIG. 1 is a sectional view showing the structure of a substrate processing apparatus used in an insulating film formation method according to the present invention.

FIG. 1 is a sectional view showing the structure of a substrate processing apparatus (referred hereinafter to as a first vertical batch ALD apparatus) used in the insulating film formation method according to the first embodiment of the present invention.

Referring to FIG. 1, the first vertical batch ALD apparatus includes: a reaction chamber 101; a wafer boat (not shown); and a plurality of first nozzles 102. The reaction chamber 101 is used to form an insulating film on each of multiple substrates 104. The wafer boat is used to mount the multiple substrates 104 so that they are aligned at given intervals in the perpendicular direction of the reaction chamber 101. The first nozzles 102 extend from bottom to top along the inner wall of the reaction chamber 101, and are provided with a great number of holes arranged in the vertical direction.

The first nozzles 102 as many as the types of gases used within the reaction chamber 101 are provided, and each of the nozzles has a great number of gas-ejecting holes which are arranged at predetermined intervals and in parallel with the substrates 104, respectively. In the insulating film formation method according to the first embodiment, in order to form a hafnium oxide film, three nozzles are provided as the first nozzles 102. The three nozzles are: a nozzle for supplying TEMAHf (tetrakis ethyl methyl amino hafnium) as a material for Hf; a nozzle for supplying $O_3$ (ozone) as a material for oxygen; and a nozzle for supplying inert gas such as $N_2$ or Ar.

Furthermore, in the first vertical batch ALD apparatus, the outside of the reaction chamber 101 is provided with a heater (not shown) for heating the whole of the reaction chamber 101. A manifold (not shown) made of stainless steel or the like is engaged to the bottom end of the reaction chamber 101, and the bottom of the reaction chamber 101 is blocked by a seal cap 103 with an airtight member such as an O ring interposed therebetween.

In forming an insulating film made of a hafnium oxide film by the vertical batch ALD apparatus shown in FIG. 1, the film formation is carried out using, for example, the following sequence. First, TEMAHf as the material for Hf is supplied to cause an adsorption reaction to the substrate surface, and then a nitrogen gas is supplied to exhaust TEMAHf remaining within the chamber. Next, an $O_3$ gas is supplied to allow the gas to react with Hf on the substrate, thereby forming a hafnium oxide film. A nitrogen gas is further supplied to exhaust an $O_3$ gas remaining within the chamber. A series of steps described above is defined as one cycle. This cycle is repeatedly carried out until a desired thickness is obtained, whereby a target insulating film can be provided.

Figure 2:
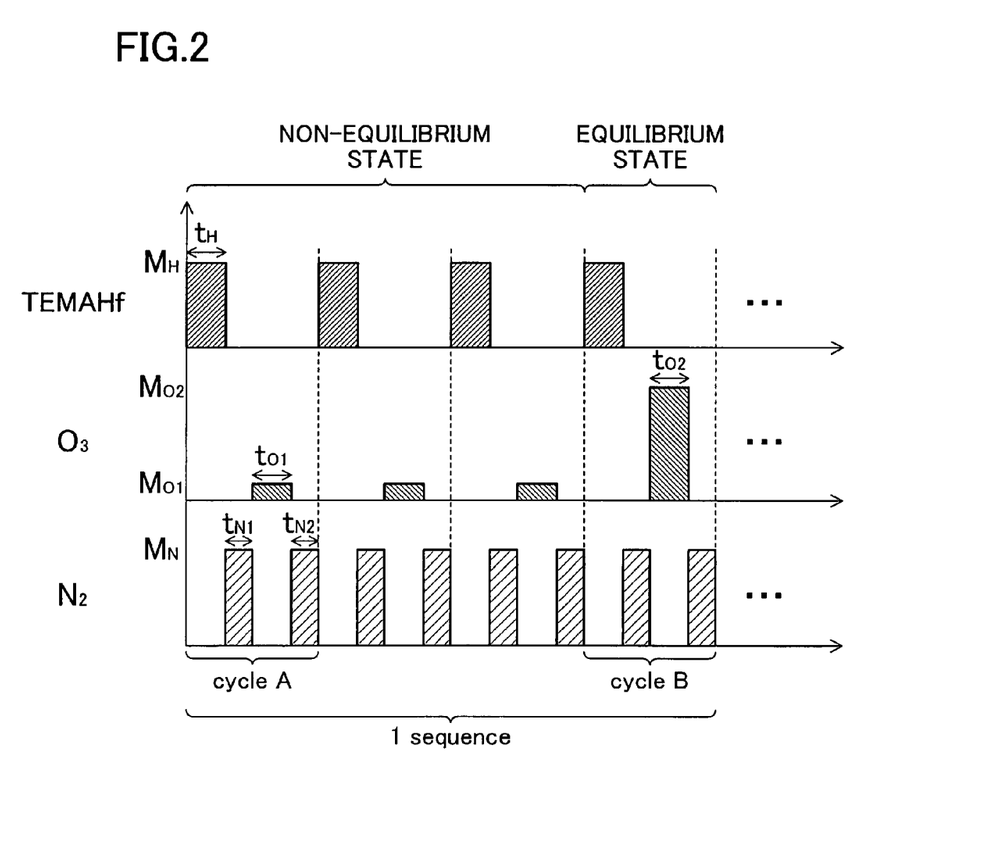
FIG. 2 is a diagram roughly showing a sequence of the insulating film formation method according to a first embodiment.

Hereinafter, the details of the insulating film formation method according to the first embodiment will be described. FIG. 2 is a diagram roughly showing the sequence of the insulating film formation method according to the first embodiment. Note that the characteristics of the insulating film formed using the sequence in the insulating film formation method of the first embodiment will be shown as (II) in FIG. 4 to be described later. On the other hand, the characteristics of the insulating film formed so that the TEMAHf supply and the $O_3$ supply are fixed throughout all cycles will be shown as (I) in FIG. 4.

As shown in FIG. 2, the insulating film formation method of the first embodiment employs a sequence made by a combined use of a cycle A and a cycle B which differ in the material gas supply. A first description will be made of a series of steps composing the cycle A.

In the cycle A, first, TEMAHf as the material gas for Hf is supplied from the first nozzle 102 onto the substrate 104 at a flow rate of $M_H$ (for example, 0.2 g/min) for $t_H$ seconds (for example, 60 seconds), thereby causing an adsorption reaction of Hf to the surface of the substrate 104. During this reaction, the temperature within the reaction chamber 101 is set at, for example, 250° C., and the pressure within the reaction chamber 101 is set at 500 Pa or lower.

Next, in order to exhaust TEMAHf remaining within the reaction chamber 101, a nitrogen gas is supplied from the first nozzle 102 into the reaction chamber 101 at a flow rate of $M_N$ (4.0 L/min(slm)) for $t_{N1}$ seconds (for example, 10 seconds). During this supply, the nitrogen gas pressure is set at 50 Pa or lower. After a nitrogen gas is supplied, the reaction chamber 101 is evacuated. Note that in this step, supply of a nitrogen gas and evacuation may be repeated one or more times.

Subsequently, $O_3$ as the material gas for oxygen is supplied from the first nozzle 102 onto the substrate 104 at a flow rate of $M_{O1}$ (0.5 L/min(slm)) for $t_{O1}$ seconds (for example, 60 seconds), whereby $O_3$ supplied is allowed to react with Hf adsorbing onto the substrate 104 to form a hafnium oxide film. During this reaction, the temperature within the reaction chamber 101 is set at, for example, 250° C., and the pressure within the reaction chamber 101 is set at 50 Pa.

In order to exhaust $O_3$ remaining within the reaction chamber 101, as in the case of exhausting TEMAHf, a nitrogen gas is supplied from the first nozzle 102 into the reaction chamber 101 at a flow rate of $M_N$ (4.0 L/min(slm)) for $t_{N2}$ seconds (for example, 10 seconds). During this supply, the nitrogen gas pressure is set at 50 Pa or lower. After a nitrogen gas is supplied, the reaction chamber 101 is evacuated. Note that also in this step, supply of a nitrogen gas and evacuation may be repeated one or more times. A series of steps described above is defined as the cycle A.

Next description will be made of the cycle B. The cycle B differs from the cycle A in conditions of the $O_3$ gas supply step. Therefore, in the process steps other than the $O_3$ gas supply step, all conditions such as flow rate, supply time, temperature, and pressure are identical to those of the cycle A.

In the cycle B, first, TEMAHf as the material gas for Hf is supplied from the first nozzle 102 onto the substrate 104, thereby causing an adsorption reaction of Hf to the surface of the substrate 104. Then, in order to exhaust TEMAHf remaining within the reaction chamber 101, a nitrogen gas is supplied into the reaction chamber 101. Thereafter, the reaction chamber 101 is evacuated. Note that in this step, supply of a nitrogen gas and evacuation may be repeated one or more times.

Next, $O_3$ as the material gas for oxygen is supplied from the first nozzle 102 onto the substrate 104 at a flow rate of $M_{O1}$ (5.0 L/min(slm)) for $t_{O2}$ seconds (for example, 60 seconds), whereby $O_3$ supplied is allowed to react with Hf adsorbing onto the substrate 104 to form a hafnium oxide film. During this reaction, the temperature within the reaction chamber 101 is set at, for example, 250° C., and the pressure within the reaction chamber 101 is set at 50 Pa.

Subsequently, as in the case of the cycle A, after a nitrogen gas is supplied from the first nozzle 102, the reaction chamber 101 is evacuated to exhaust an $O_3$ gas remaining within the reaction chamber 101. A series of steps described above is defined as the cycle B.

In the insulating film formation method of the first embodiment, as shown in FIG. 2, a sequence in which the cycle A is repeatedly carried out three times and then the cycle B is carried out once is defined as one sequence. By repeatedly conducting this sequence until a desired thickness is obtained, an insulating film can be formed. The process steps contained in the respective cycles are carried out to provide the following advantages.

For the cycle A, the $O_3$ gas flow rate Mol can be set as low as 0.5 L/min(slm) to pass an $O_3$ gas onto the substrate in the form of a laminar flow. Therefore, the thickness uniformity within the substrate 104 can be improved. On the other hand, for the cycle B, the $O_3$ gas flow rate $M_{O2}$ can be set as high as 5.0 L/min(slm) to pass an $O_3$ gas onto the substrate 104 in the form of a turbulent flow. This tends to provide a poor thickness uniformity. However, since an $O_3$ gas spreads evenly onto the substrate 104, a surface reaction of $O_3$ with Hf adsorbing onto the substrate 104 can be caused in an equilibrium state to improve the film composition uniformity within the substrate 104.

Figure 3:
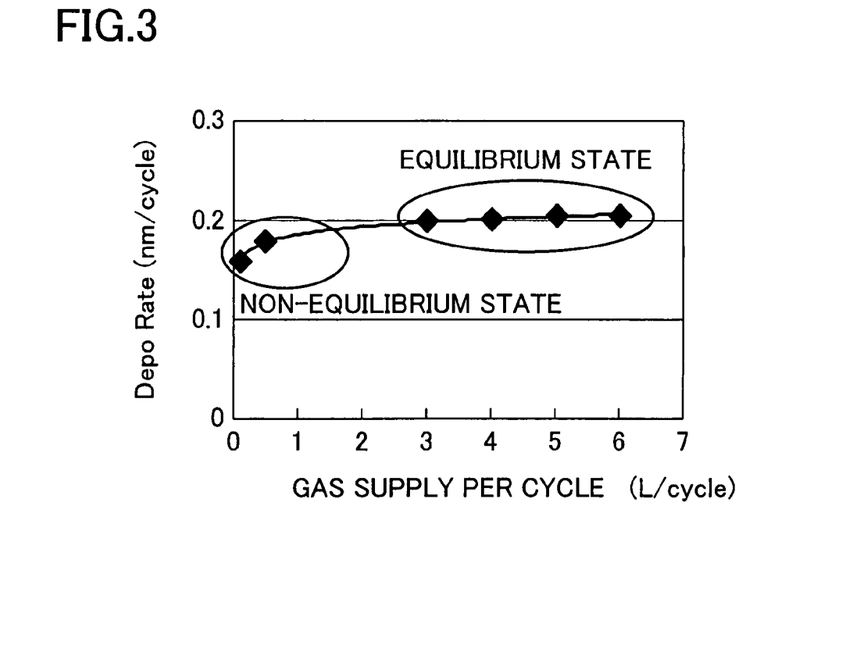
FIG. 3 is a graph showing the relation between the gas supply per cycle and the film formation rate in the insulating film formation method according to the first embodiment.

Herein, the equilibrium state described above will be described using FIG. 3. FIG. 3 is a graph showing the relation between the gas supply per cycle and the film formation rate in the insulating film formation method according to the first embodiment. In FIG. 3, the gas supply is defined by the product of the gas flow rate and the supply time. As shown in FIG. 3, the film formation rate becomes saturated as the gas supply increases, and reaction proceeds in an equilibrium state. On the other hand, in the state of a small gas supply, the film formation rate is not saturated and reaction proceeds in a non-equilibrium state. Therefore, in the cycle A described above, since a low gas flow rate decreases the gas supply, Hf and $O_3$ react in a non-equilibrium state. In contrast to this, in the cycle B, since a high gas flow rate increases the gas supply, Hf and $O_3$ react in an equilibrium state.

In the insulating film formation method of the first embodiment, for example, the cycle A in which reaction proceeds in a non-equilibrium state is carried out three times as the first three cycles, and an $O_3$ gas is supplied at a low flow rate. This prevents passage of the $O_3$ gas in the form of a turbulent flow, and thus the insulating film can be formed with the $O_3$ gas supplied in the form of a laminar flow. Therefore, a hafnium oxide film with an excellent thickness uniformity can be formed. Furthermore, after the cycle A is repeatedly carried out three times, the cycle B is carried out once and an $O_3$ gas is supplied at a high flow rate. Thus, the insulating film is formed in an equilibrium state. Therefore, variations in the composition of the insulating film within the substrate can be reduced which are feared in the reaction proceeding in a non-equilibrium state, so that a hafnium oxide film with an excellent film composition uniformity can be formed. Accordingly, with the insulating film formation method of the first embodiment, the cycles described above are used as one sequence and this sequence is repeated until a desired thickness is obtained. Thereby, the insulating film with a good thickness uniformity as well as a good film composition uniformity within the substrate can be formed.

With the insulating film formation method of the present invention, a hafnium oxide film with an oxygen/hafnium content of 2.1 or more can be formed.

Figure 4:
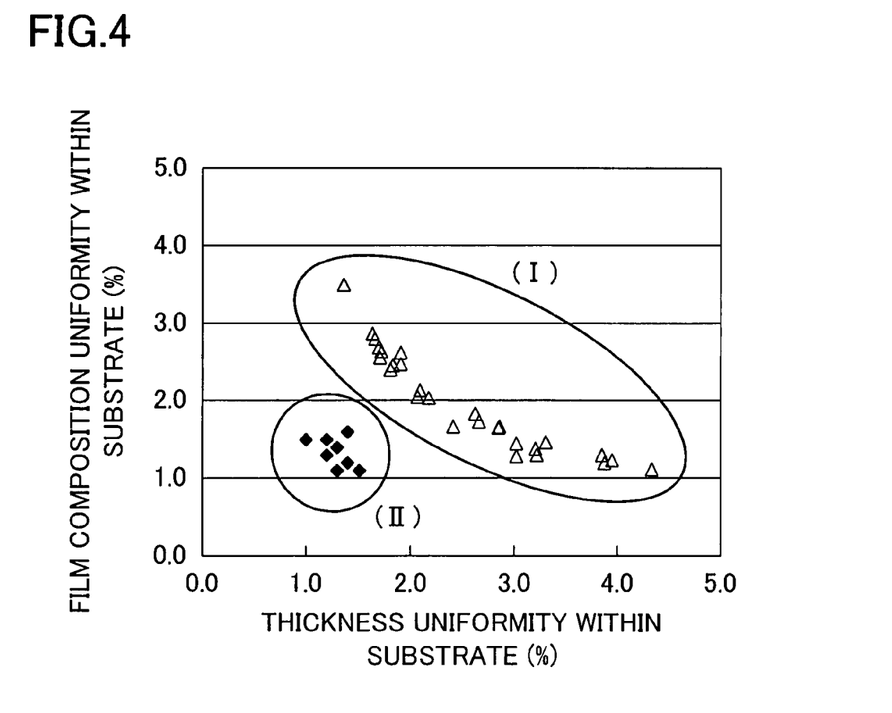
FIG. 4 is a graph showing the relation between the thickness uniformity and the film composition uniformity obtained from insulating films formed by carrying out insulating film formation methods according to the first embodiment and a comparative example, respectively, by a first vertical batch ALD apparatus.

As described above, in the insulating film formation method of the first embodiment, the sequence made by a combined use of cycles differing in film formation conditions can be employed to provide the insulating film with a good thickness uniformity as well as a good film composition uniformity as shown in FIG. 4.

FIG. 4 is a graph showing the relation between the thickness uniformity and the film composition uniformity of the insulating film formed by the first vertical batch ALD apparatus. In FIG. 4, the result shown by (I) is obtained from the insulating film formed so that the TEMAHf supply and the $O_3$ supply are fixed throughout all cycles, while the result shown by (II) is obtained from the insulating film formed by the insulating film formation method of the first embodiment. It can be said that a lower thickness uniformity and a lower film composition uniformity are better. As shown by (I) in FIG. 4, with the insulating film formation method in which the monotonous cycles mentioned above are repeated, the film composition uniformity becomes poor as the thickness uniformity is improved, and also the thickness uniformity becomes poor as the film composition uniformity is improved. On the other hand, with the insulating film formation method of the first embodiment, as shown by (II) in FIG. 4, a good result is obtained, that is, both of the thickness uniformity and the film composition uniformity within the substrate can fall within 2%. Thus, it can be confirmed that with the insulating film formation method of the first embodiment, the thickness uniformity can be improved and concurrently the film composition uniformity can be improved.

In the insulating film formation method of the first embodiment, as one sequence, the cycle A in which reaction is caused in a non-equilibrium state is carried out three times and then the cycle B in which reaction is caused in an equilibrium state is carried out once. However, the composition of the sequence is not limited to this, and alternatively the sequence may be composed so that the cycle A is carried out M times and the cycle B is carried out N times. Note that this alternative sequence satisfies $M \geq 1$ and $N \geq 1$.

Moreover, in the insulating film formation method of the first embodiment, description has been made of the exemplary case where a hafnium oxide film is formed as a metal oxide of a high dielectric constant material serving as a material for a capacitor insulating film, but the metal oxide is not limited to this. As the metal oxide, use may be made of another metal oxide containing a group-III element such as lanthanoid, actinoid, and aluminum, a group-IV element such as zirconium, and a group-V element such as tantalum.

In the insulating film formation method of the first embodiment, the hafnium oxide film used as the capacitor insulating film has been described. However, the capacitor insulating film is not limited to this, and a metal oxide used in another device such as a metal oxide used for a gate insulating film can also be used to provide the same effects.

In the insulating film formation method of the first embodiment, the hafnium oxide film formation method by the ALD method has been exemplarily described, but the first embodiment is not limited to this. Alternatively, an insulating film of silicon nitride, silicon oxide, or the like formed by an ALD method can also be formed in the same manner, and thereby an insulating film with a good thickness uniformity and a good composition uniformity can be provided.

In this alternative, preferably, a product of the reaction of a silicon chloride-based material or a silicon organic chloride-based material with ammonia is used as silicon nitride and a product of the reaction of a silicon chloride-based material or a silicon organic chloride-based material with ozone is used as silicon oxide. In this case, more preferably, the silicon chloride-based material used is dichlorosilane or hexachlorodisilane. Further more preferably, the silicon organic chloride-based material used is one selected from BTBAS (Bis-Tertiary-Butyl-Amino-Silane), TRIES (TRI-Ethoxy-Silane), and TDMAS (Tetrakis-Di-Methyl-Amino-Silane). Instead of ammonia, use may be made of ammonia radicals treated by a remote plasma or preheated ammonia.

Second Embodiment

Figure 5:
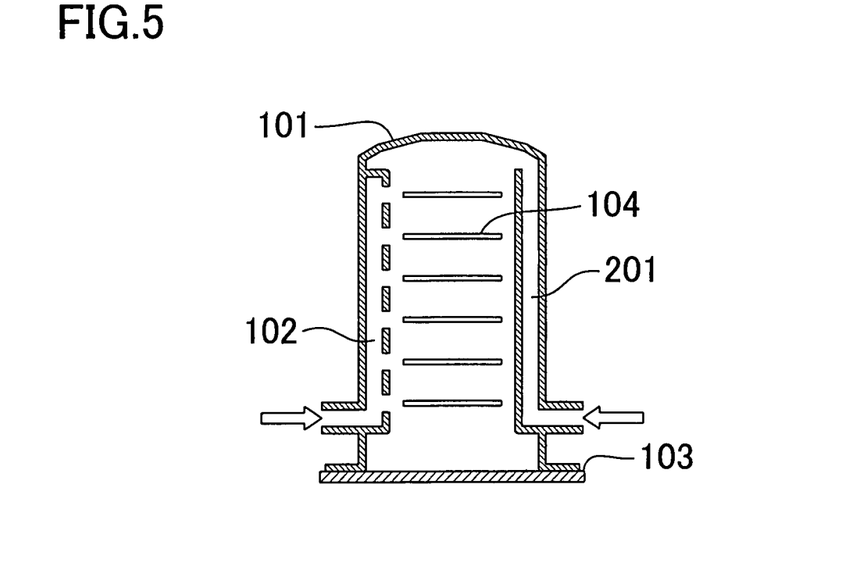
FIG. 5 is a sectional view showing the structure of a substrate processing apparatus according to a second embodiment of the present invention.

An insulating film formation method and a substrate processing apparatus according to a second embodiment of the present invention will be described below with reference to the accompanying drawings. This description will be made exemplarily using formation of a capacitor insulating film made of a hafnium oxide film. FIG. 5 is a sectional view showing the structure of a substrate processing apparatus (referred hereinafter to as a second vertical batch ALD apparatus) according to the second embodiment of the present invention.

Referring to FIG. 5, the second vertical batch ALD apparatus includes: a reaction chamber 101; a wafer boat (not shown); a plurality of first nozzles 102; and a second nozzle 201. The reaction chamber 101 is used to form an insulating film on each of multiple substrates 104. The wafer boat is used to mount the multiple substrates 104 so that they are aligned at given intervals in the perpendicular direction of the reaction chamber 101. The first nozzles 102 extend from bottom to top along the inner wall of the reaction chamber 101, and are provided with a great number of holes arranged in the vertical direction. The second nozzle 201 extends from bottom to top along the inner wall of the reaction chamber 101, and is provided at its top portion with a gas supply orifice for supplying gas.

The plurality of first nozzles 102 are provided according to the types of gases used within the reaction chamber 101, and each of the nozzles has a great number of gas-ejecting holes which are arranged at predetermined intervals and in parallel with the substrates 104, respectively. In the insulating film formation method according to the second embodiment, in order to form a hafnium oxide film, two nozzles are provided as the first nozzles 102. The two nozzles are: a nozzle for supplying $O_3$ (ozone) as a material for oxygen; and a nozzle for supplying inert gas such as $N_2$ or Ar. On the other hand, from the second nozzle 201, TEMAHf as a material for Hf is supplied onto the substrates 104.

Furthermore, like the first vertical batch ALD apparatus of the first embodiment, in the second vertical batch ALD apparatus, the outside of the reaction chamber 101 is provided with a heater (not shown) for heating the whole of the reaction chamber 101. A manifold (not shown) made of stainless steel or the like is engaged to the bottom end of the reaction chamber 101, and the bottom of the reaction chamber 101 is blocked by a seal cap 103 with an airtight member such as an O ring interposed therebetween.

Figure 6:
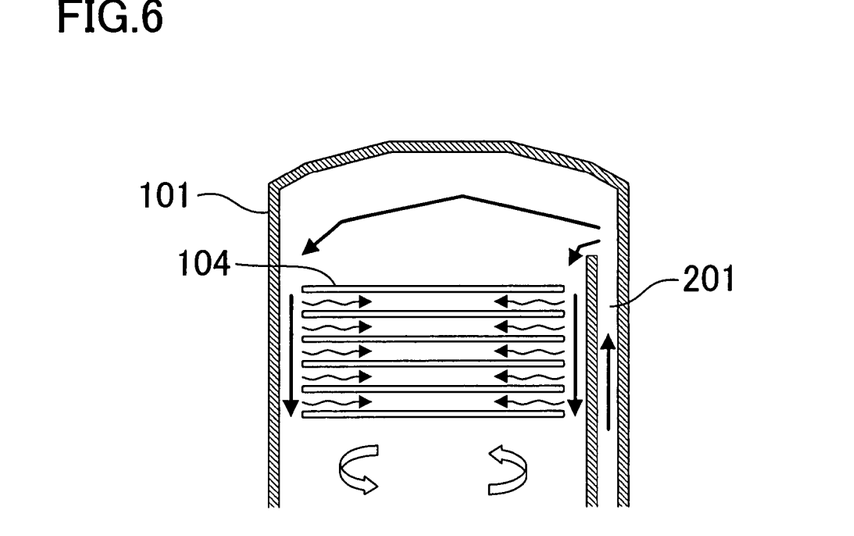
FIG. 6 is a view showing an upper portion of a reaction chamber 101 of the substrate processing apparatus according to the second embodiment.

FIG. 6 is a view showing the upper portion of the reaction chamber 101 of the substrate processing apparatus according to the second embodiment. The substrate processing apparatus of the second embodiment is characterized in that the second nozzle 201 for supplying TEMAHf more highly reactive than $O_3$ is separately provided. Thus, as shown in FIG. 6, a highly reactive gas supplied through the second nozzle flows onto each substrate in the form of a laminar flow. Therefore, variations in the flow rate of the gas supplied onto the substrate can be reduced to provide an insulating film with a good thickness uniformity. Moreover, the second nozzle 201 can have a gas supply orifice with an increased diameter as compared with the holes formed in the first nozzle 102. Therefore, even in supplying a highly reactive gas, the occurrence of particles as reaction products can be suppressed. As a result of this, with the substrate processing apparatus of the second embodiment, an insulating film having a good thickness uniformity and a good film composition uniformity within the substrate can be formed.

Next, the insulating film formation method by the second vertical batch ALD apparatus of the second embodiment will be described with reference to the accompanying drawings. First, the characteristics of the insulating film formed on each of the substrates 104 within the reaction chamber 101 will be described using FIGS. 7A to 7D. FIGS. 7A to 7D are graphs showing the characteristics of the insulating films formed on the substrates disposed at the top, center, and bottom portions of the inside of the reaction chamber 101. FIGS. 7A, 7B, 7C, and 7D are graphs showing the thicknesses, the O/Hf contents, the Hf doses, and the O doses of the insulating films, respectively, formed on the substrates disposed at those portions. FIGS. 7A to 7D show the results obtained by measuring the characteristics of the insulating films formed so that the TEMAHf supply and the $O_3$ supply are fixed throughout all cycles. The measurement was made of the case where the $O_3$ is supplied at flow rates of 5 L/min(slm), 1 L/min(slm), and 0.5 L/min(slm).

Figure 7A:
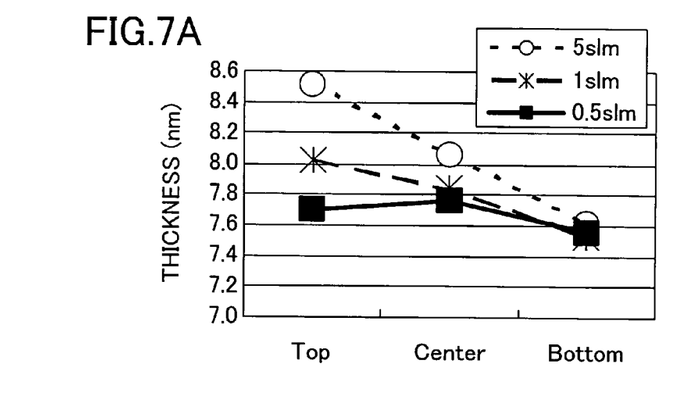
FIGS. 7A to 7D are graphs showing the characteristics of insulating films formed on substrates disposed at top, center, and bottom portions of the inside of the reaction chamber 101.

As shown in FIG. 7A, for a flow rate of 5 L/min(slm), the thickness of the insulating film formed on the substrate is greater at the top portion than at the bottom portion, so that the substrate-to-substrate thickness uniformity becomes poor. When the $O_3$ flow rate is 0.5 L/min(slm), the substrate-to-substrate thickness uniformity becomes good. However, noting the O/Hf content shown in FIG. 7B, when the $O_3$ flow rate is 0.5 L/min(slm), the difference in O/Hf content between the substrates at the bottom and top portions is wide, so that the substrate-to-substrate film composition uniformity becomes poor. This concerns the Hf and O doses shown in FIGS. 7C and 7D, respectively.

Figure 7B:
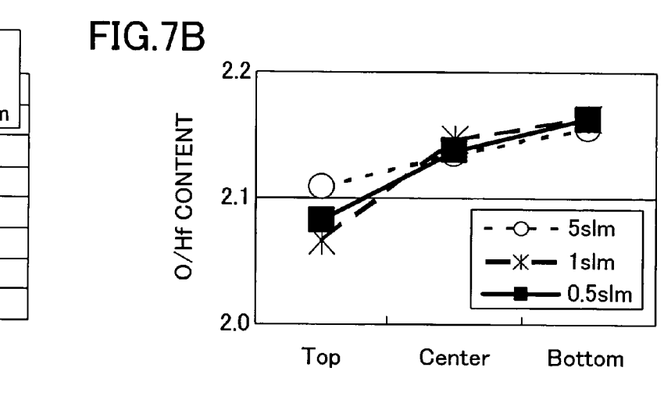
Figure 7C:
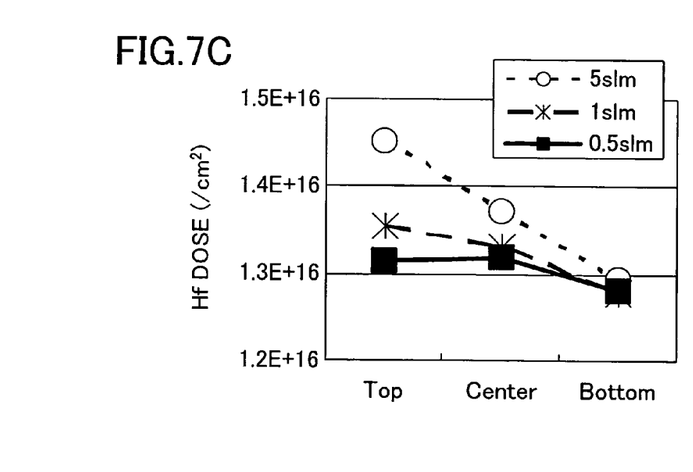
Figure 7D:
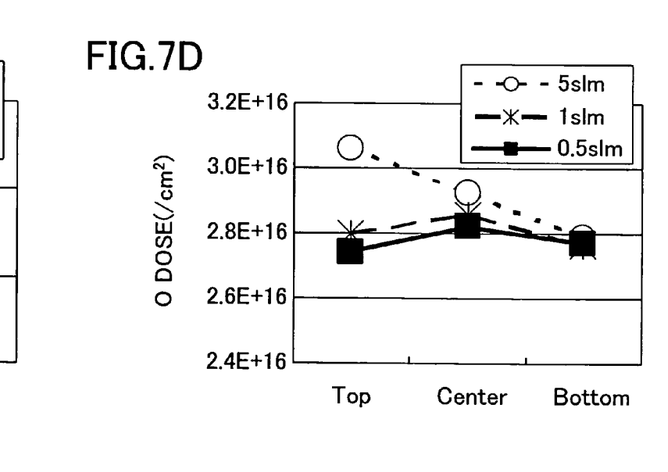

As shown in FIG. 7C, when the $O_3$ flow rate is decreased from 5.0 L/min(slm) to 0.5 L/min(slm), the Hf dose at the top portion can be reduced. Thus, variations in the substrate-to-substrate Hf dose become small. However, as shown in FIG. 7D, by setting the $O_3$ flow rate at 0.5 L/min(slm), the O dose is also reduced simultaneously and the amount of the reduced O dose at this time is greater than the amount of the reduced Hf dose. As a result, as shown in FIG. 7B, the O/Hf content at the top portion is reduced, so that the substrate-to-substrate film composition uniformity becomes poor.

The insulating film formation method according to the second embodiment employs the second vertical batch ALD apparatus and the same method as the insulating film formation method of the first embodiment. Thereby, substrate-to-substrate variations in the film composition mentioned above can be reduced to provide an insulating film with a good film composition uniformity and a good thickness uniformity. Hereinafter, the insulating film formation method of the second embodiment will be described in detail.

Like the insulating film formation method of the first embodiment, the insulating film formation method of the second embodiment employs a sequence made by a combined use of a cycle A and a cycle B. The insulating film formation method of the second embodiment differs from the first embodiment in that TEMAHf as the material gas for Hf is supplied from the second nozzle. Therefore, in process steps other than this step, all process conditions such as flow rate, supply time, temperature, and pressure are the same as those of the first embodiment. A first description will be made of a series of steps composing the cycle A.

In the cycle A, first, TEMAHf as the material gas for Hf is supplied from the second nozzle 201 onto the substrate 104 at a flow rate of $M_H$ (for example, 0.2 g/min) for $t_H$ seconds (for example, 60 seconds), thereby causing an adsorption reaction of Hf to the surface of the substrate 104.

Next, in order to exhaust TEMAHf remaining within the reaction chamber 101, a nitrogen gas is supplied from the first nozzle 102. Then, the reaction chamber 101 is evacuated. Note that in this step, supply of a nitrogen gas and evacuation may be repeated one or more times.

Subsequently, $O_3$ as the material gas for oxygen is supplied from the first nozzle 102 onto the substrate 104 at a flow rate of $M_{O1}$ (0.5 L/min(slm)) for $t_{O1}$ seconds (for example, 60 seconds), whereby $O_3$ supplied is allowed to react with Hf adsorbing onto the substrate 104 to form a hafnium oxide film.

In order to exhaust $O_3$ remaining within the reaction chamber 101, as in the case of exhausting TEMAHf, a nitrogen gas is supplied from the first nozzle 102. Then, the reaction chamber 101 is evacuated. Note that also in this step, supply of a nitrogen gas and evacuation may be repeated one or more times. A series of steps described above is defined as the cycle A.

Next description will be made of the cycle B. The cycle B differs from the cycle A in conditions of the $O_3$ gas supply step. Therefore, in the process steps other than the $O_3$ gas supply step, all conditions such as flow rate, supply time, temperature, and pressure are identical to those of the cycle A.

In the cycle B, first, TEMAHf as the material gas for Hf is supplied from the second nozzle 201 onto the substrate 104, thereby causing an adsorption reaction of Hf to the surface of the substrate 104. Then, in order to exhaust TEMAHf remaining within the reaction chamber 101, a nitrogen gas is supplied into the reaction chamber 101. Thereafter, the reaction chamber 101 is evacuated. Note that in this step, supply of a nitrogen gas and evacuation may be repeated one or more times.

Next, $O_3$ as the material gas for oxygen is supplied from the first nozzle 102 onto the substrate 104 at a flow rate of $M_{O1}$ (5.0 L/min(slm)) for $t_{O2}$ seconds (for example, 60 seconds), whereby $O_3$ supplied is allowed to react with Hf adsorbing onto the substrate 104 to form a hafnium oxide film.

Subsequently, as in the case of the cycle A, after a nitrogen gas is supplied from the first nozzle 102, the reaction chamber 101 is evacuated to exhaust an $O_3$ gas remaining within the reaction chamber 101. A series of steps described above is defined as the cycle B.

In the insulating film formation method of the second embodiment, a sequence in which, for example, the cycle A is repeatedly carried out three times and then the cycle B is carried out once is defined as one sequence. By repeatedly conducting this sequence until a desired thickness is obtained, an insulating film can be formed which has a good substrate-to-substrate thickness uniformity and a good substrate-to-substrate film composition uniformity shown in FIGS. 8A and 8B.

Figure 8A:
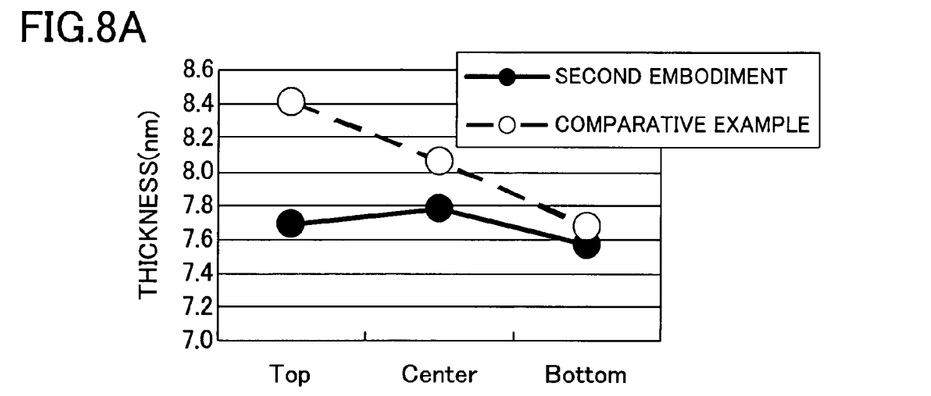
FIGS. 8A and 8B are graphs showing the thicknesses and the O/Hf contents of insulating films formed by the insulating film formation method of the second embodiment and an insulating film of a comparative example, respectively.
Figure 8B:
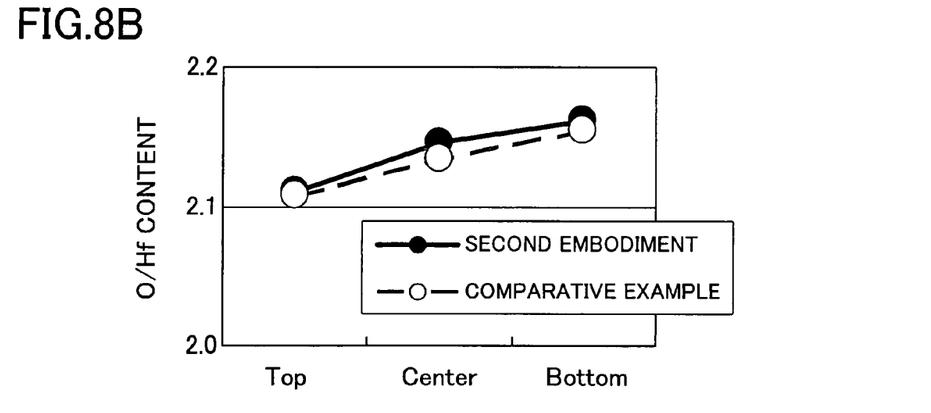

FIGS. 8A and 8B are graphs showing the thicknesses and the O/Hf contents of the insulating films which are formed on the substrates located at the respective portions by the insulating film formation method of the second embodiment. As shown in FIGS. 8A and 8B, as compared with the insulating films of the comparative example, the insulating films provided by the insulating film formation method of the second embodiment have a good substrate-to-substrate thickness uniformity and a good film composition uniformity. Note that the insulating film of the comparative example is a hafnium oxide film formed by the second vertical batch ALD apparatus shown in FIG. 5 so that the TEMAHf supply and the $O_3$ supply (5.0 L/min(slm)) are fixed throughout all cycles.

In the insulating film formation method of the second embodiment, by the second vertical batch ALD apparatus, the cycle A in which reaction proceeds in a non-equilibrium state is carried out three times as the first three cycles, and an $O_3$ gas is supplied at a low flow rate. This prevents passage of the $O_3$ gas in the form of a turbulent flow, and thus the insulating film can be formed with the $O_3$ gas supplied in the form of a laminar flow. Therefore, a hafnium oxide film with an excellent thickness uniformity within the substrate can be formed. In addition, since TEMAHf is supplied from the top of the second nozzle, the reaction of TEMAHf easily proceeds on the substrate disposed at the top portion of the reaction chamber, resulting in widened substrate-to-substrate variations. Even such a trouble can be avoided by the approach in which by supplying an $O_3$ gas at a low flow rate, the reaction on the substrate disposed at the top portion is suppressed. Thus, a hafnium oxide film with a good substrate-to-substrate thickness uniformity can be formed.

Furthermore, after the cycle A is repeatedly carried out three times, the cycle B is carried out once and an $O_3$ gas is supplied at a high flow rate. Thereby, the insulating film is formed in an equilibrium state. Therefore, variations in the composition of the insulating film within the substrate can be reduced which are feared in the reaction proceeding in a non-equilibrium state, so that a hafnium oxide film with an excellent film composition uniformity can be formed. Moreover, since an $O_3$ gas can be supplied at a high flow rate to increase the O dose, potential substrate-to-substrate variations in film compositions occurring during the steps in the cycle A can be eliminated to provide a hafnium oxide film with an excellent substrate-to-substrate film composition uniformity. Note that as shown in FIG. 8B, the hafnium oxide film provided by the insulating film formation method of the second embodiment has an oxygen/hafnium content of 2.1 or higher.

As described above, in the insulating film formation method of the second embodiment, by the second vertical ALD apparatus, the cycles shown above are used as one sequence and this sequence is repeated until a desired thickness is obtained. Thereby, the insulating film with good thickness uniformities and good film composition uniformities both within the substrate and among the substrates can be formed.

In the insulating film formation method of the second embodiment, as one sequence, the cycle A in which reaction is caused in a non-equilibrium state is carried out three times and the cycle B in which reaction is caused in an equilibrium state is carried out once. However, the composition of the sequence is not limited to this, and alternatively the sequence may be composed so that the cycle A is carried out M times and the cycle B is carried out N times. Note that this alternative sequence satisfies $M \geq 1$ and $N \geq 1$.

Moreover, in the insulating film formation method of the second embodiment, description has been made of the exemplary case where a hafnium oxide film is formed as a metal oxide of a high dielectric constant material serving as a material for a capacitor insulating film, but the metal oxide is not limited to this. As the metal oxide, use may be made of another metal oxide containing a group-III element such as lanthanoid, actinoid, and aluminum, a group-IV element such as zirconium, and a group-V element such as tantalum.

In the insulating film formation method of the second embodiment, the hafnium oxide film used as the capacitor insulating film has been described. However, the capacitor insulating film is not limited to this, and a metal oxide used in another device such as a metal oxide used for a gate insulating film can also be used to provide the same effects.

In the insulating film formation method of the second embodiment, the hafnium oxide film formation method by the ALD method has been exemplarily described, but the second embodiment is not limited to this. Alternatively, an insulating film of silicon nitride, silicon oxide, or the like formed by an ALD method can also be formed in the same manner, and thereby an insulating film with a good thickness uniformity and a good composition uniformity can be provided.

In this alternative, preferably, a product of the reaction of a silicon chloride-based material or a silicon organic chloride-based material with ammonia is used as silicon nitride and a product of the reaction of a silicon chloride-based material or a silicon organic chloride-based material with ozone is used as silicon oxide. In this case, more preferably, the silicon chloride-based material used is dichlorosilane or hexachlorodisilane. Further more preferably, the silicon organic chloride-based material used is one selected from BTBAS (Bis-Tertiary-Butyl-Amino-Silane), TRIES (TRI-Ethoxy-Silane), and TDMAS (Tetrakis-Di-Methyl-Amino-Silane).

In the insulating film formation method of the second embodiment, preferably, the material gas supplied through the second nozzle 201 is more highly reactive or more easily thermally-decomposable than at least the gas supplied through the first nozzle. In this case, preferably, the material gas supplied through the first nozzle 102 has a smaller molecular weight than the gas supplied through the second nozzle 201.

Third Embodiment

Figure 9:
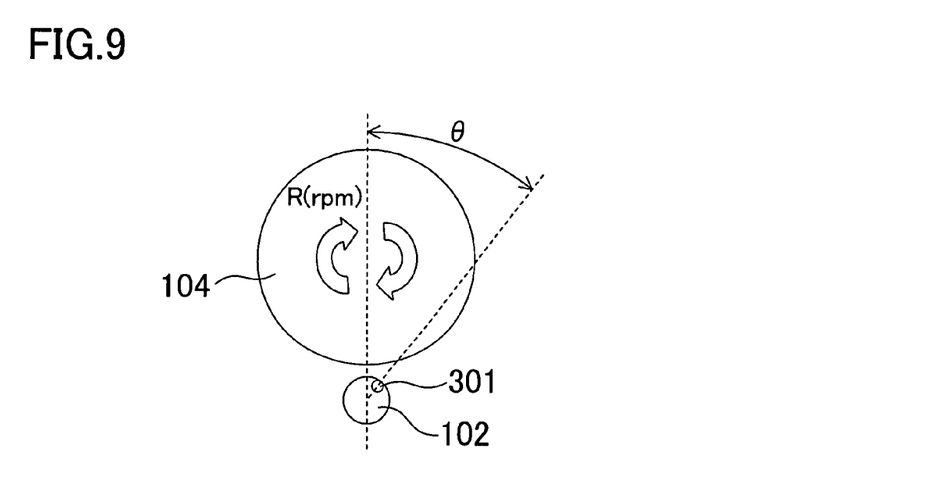
FIG. 9 is a top view partly showing the structure of a substrate processing apparatus according to a third embodiment of the present invention.

A substrate processing apparatus according to a third embodiment of the present invention will be described below with reference to the accompanying drawings. The substrate processing apparatus of the third embodiment (referred hereinafter to as a third vertical batch ALD apparatus) has the structure in which holes provided in a first nozzle are arranged at different positions from those of the first vertical batch ALD apparatus of the first embodiment. FIG. 9 is a top view partly showing the structure of the substrate processing apparatus according to the third embodiment of the present invention.

Referring to FIG. 9, the third vertical batch ALD apparatus includes: a reaction chamber 101 (not shown); a wafer boat (not shown); and a plurality of first nozzles 102. The reaction chamber 101 is used to form an insulating film on each of multiple substrates 104. The wafer boat is used to mount the multiple substrates 104 so that they are aligned at given intervals in the perpendicular direction of the reaction chamber 101. The first nozzles 102 extend from bottom to top along the inner wall of the reaction chamber 101, and each of the nozzles is provided with a great number of first holes 301 for supplying gas, which are arranged in the vertical direction. When the angle formed between: a straight line (used as a reference line) connecting the central axis of the first nozzle 102 on a cut surface thereof in parallel with the principal plane of the substrate 104 and the central axis of the substrate 104; and a straight line connecting the central axis of the first nozzle and the center of each of the first holes is defined as θ, the first hole 301 is arranged so that the angle θ ranges from 5° to 90° inclusive. The wafer boat is provided with a rotating mechanism for rotating the boat around the central axis thereof (the central axis of the substrates) extending in the perpendicular direction. In forming the insulating film, the substrate 104 rotates at a rotation speed R (rpm) in a clockwise direction as viewed from above.

Although not shown, the third vertical batch ALD apparatus is additionally provided with a heater or a seal cap as in the case of the first vertical batch ALD apparatus of the first embodiment.

The substrate processing apparatus of the third embodiment is characterized in that the first hole 301 provided in the first nozzle 102 is formed at a location forming the angle θ with respect to the reference line. This enables supply of gas even onto the center portion of the substrate 104 as will be described later, so that film thickness variations within the substrate 104 such that the film thickness is greater at the edge portion of the substrate 104 and smaller at the center portion thereof can be reduced to provide an insulating film with an excellent thickness uniformity within the substrate. Furthermore, in order to provide a uniform thickness within the substrate, the process conditions must be appropriately changed in the manner in which, for example, the flow rate of the material gas is raised or the rotation speed R of the substrate is reduced to take a longer time to this process. However, with the substrate processing apparatus of the third embodiment, such a change is not required, and thus an insulating film with a good thickness uniformity can be formed relatively easily.

Figure 10:
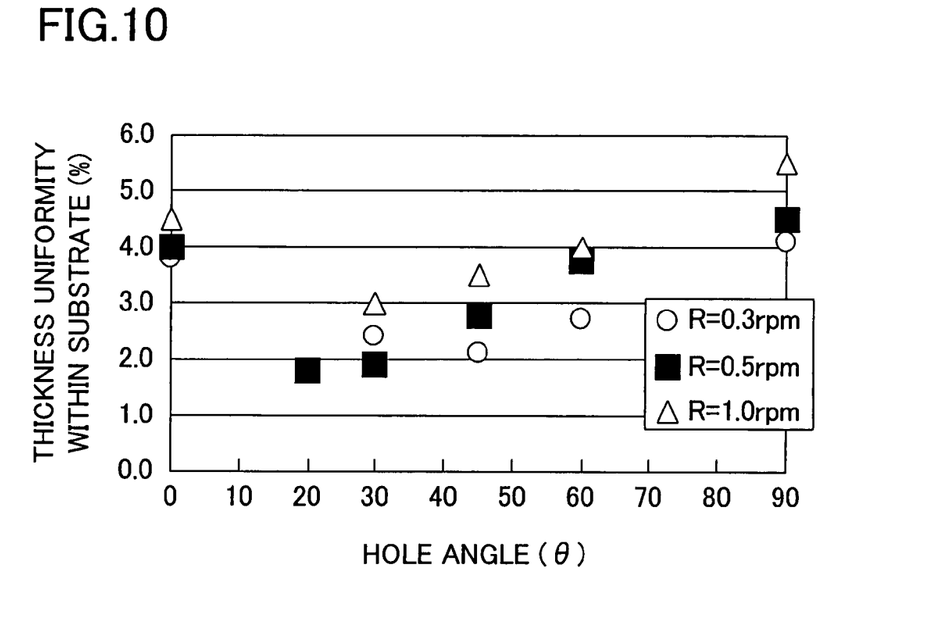
FIG. 10 is a graph showing the relation between the angle θ of a first hole and the thickness uniformity obtained by a third vertical batch ALD apparatus according to the third embodiment.

FIG. 10 is a graph showing the relation between the angle θ of the first hole 301 and the thickness uniformity obtained by the third vertical batch ALD apparatus according to the third embodiment. The rotation speed R of the substrate is changed to 0.3 rpm, 0.5 rpm, and 1.0 rpm. As shown in FIG. 10, when the angle θ is set at 20 to 60°, good thickness uniformities within the substrate are obtained from the respective numbers R of rotations. Therefore, in the substrate processing apparatus of the third embodiment, the angle θ of the first hole 301 with respect to the reference line ranges preferably from 5° to 90° inclusive, more preferably, 5° to 60° inclusive. Preferably, the angle θ with respect to the reference line is set by circularly shifting the hole in the same direction of rotation as the substrate 104.

Figure 11A:
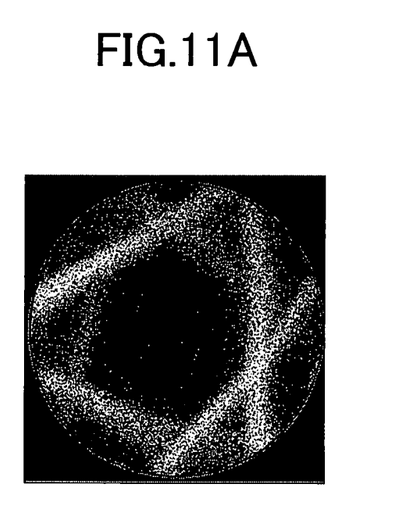
FIGS. 11A and 11B are views showing gas flow paths on substrates obtained by the third vertical batch ALD apparatus of the third embodiment.
Figure 11B:
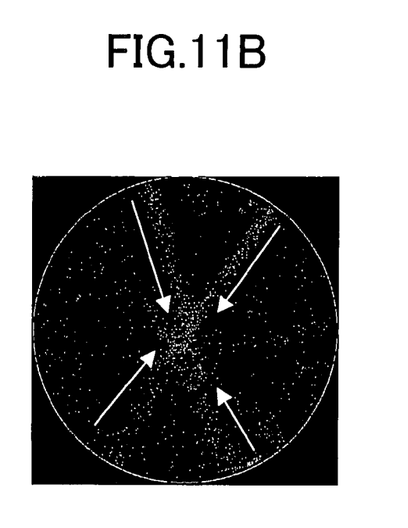

FIGS. 11A and 11B are views showing gas flow paths on the substrates obtained by the third vertical batch ALD apparatus of the third embodiment. FIG. 11A is a view showing the path of the gas flowing on the substrate in the case of θ=0° and R=0.5 rpm. FIG. 11B is a view showing the path of the gas flowing on the substrate in the case of θ=20° and R=0.5 rpm. As can-be seen from FIGS. 11A and 11B, in the case of θ=20°, the gas flows to the center portion of the substrate as compared with the case of θ=0°.

In the third embodiment, the direction of rotation of the substrate 104 is set in a clockwise direction and the angle 0 of the first hole 301 is set by circularly shifting the hole clockwise from the reference line. Even though the direction of rotation of the substrate 104 is set in a counterclockwise direction and the angle θ of the first hole 301 is set by circularly shifting the hole counterclockwise from the reference line, the same effects as described above can be provided.

An insulating film may be formed by carrying out the insulating film formation method described in the first or second embodiment by the third vertical batch ALD apparatus of the third embodiment. In this case, an insulating film with a better thickness uniformity and a better film composition uniformity within the substrate can be formed.

In the third vertical batch ALD apparatus of the third embodiment, as in the case of the second vertical batch ALD apparatus of the second embodiment, a second nozzle may be additionally provided which is formed at its top portion with a gas supply orifice for supplying a highly reactive gas. In this case, in addition to the above effects, an insulating film with excellent thickness uniformities and excellent film composition uniformities both within the substrate and among the substrates can be provided.

What is claimed is:

1. An insulating film formation method comprising:
the step (a) of supplying a first material gas onto a plurality of substrates aligned at given intervals within a chamber of a substrate processing apparatus in the perpendicular direction of the chamber, thereby forming an atomic layer on each of the plurality of substrates;
the step (b) of supplying, after the step (a), a first supply amount of a second material gas onto the plurality of substrates to allow the second material gas to react with the atomic layer on each of the substrates in a non-equilibrium state; and
the step (c) of supplying, after the step (a), a second supply amount of the second material gas onto the plurality of the substrates to allow the second material gas to react with the atomic layer in an equilibrium state,
wherein steps (a) and (b) are repeatedly carried out alternately M ($1 \leq M$) times and then the steps (a) and (c) are repeatedly carried out alternately N ($1 \leq N$) times, so as to form an insulating film,
the non-equilibrium state in the step (b) is a state in which a forming rate of the insulating film is not saturated under the first supply amount of a second material gas, and
in the step (c), the second supply amount is larger than the first supply amount and the forming rate of the insulating film is saturated.

2. The method of claim 1,
wherein the step (b) further includes: the substep of supplying, before supply of the second material gas, an inert gas into the chamber to exhaust the first material gas remaining within the chamber; and the substep of supplying, an inert gas into the chamber to exhaust the second material gas remaining within the chamber, and
the step (c) further includes: the substep of supplying, before supply of the second material gas, an inert gas into the chamber to exhaust the first material gas remaining within the chamber; and the substep of supplying, an inert gas into the chamber to exhaust the second material gas remaining within the chamber.

3. The method of claim 1, wherein the insulating film is made of an oxide of metal, and the metal includes any selected from group-III elements, group-IV elements, and group-V elements.

4. The method of claim 3, wherein the first material gas includes any of lanthanoid, actinoid, aluminum, zirconium, hafnium, and tantalum, and the second material gas includes ozone.

5. The method of claim 1, wherein the insulating film is made of silicon nitride.

6. The method of claim 5, wherein the first material gas includes a silicon chloride-based material or a silicon organic chloride-based material, and the second material gas includes ammonia.

7. The method of claim 6, wherein the silicon chloride-based material is dichlorosilane or hexachlorodisilane.

8. The method of claim 6, wherein the silicon organic chloride-based material is one selected from BTBAS, TRIES, and TDMAS.

9. The method of claim 1, wherein the insulating film is made of silicon oxide.

10. The method of claim 9, wherein the first material gas includes a silicon chloride-based material or a silicon organic chloride-based material, and the second material gas includes ozone.

11. The method of claim 10, wherein the silicon chloride-based material is dichlorosilane or hexachlorodisilane.

12. The method of claim 10, wherein the silicon organic chloride-based material is one selected from BTBAS, TRIES, and TDMAS.

13. The method of claim 1,
wherein the substrate processing apparatus includes: a first nozzle of a straight tube shape having a gas supply orifice formed at a top portion of the chamber; and a second nozzle having holes formed at multiple locations in a vertical direction, respectively,
in the step (a), the first material gas is supplied from the first nozzle, and
in the steps (b) and (c), the second material gas is supplied from the second nozzle.

14. The method of claim 13, wherein the first material gas is a gas more highly reactive than the second material gas.

15. The method of claim 13, wherein the second material gas has a smaller molecular weight than the first material gas.

16. The method of claim 13,
wherein in the steps (b) and (c), the insulating film is formed by rotating the substrates around the rotation axis extending perpendicularly through the centers of the substrates, and
the second material gas is supplied onto the substrates so that the angle formed between: a straight line connecting the central axis of the second nozzle on a cut surface thereof in parallel with the principal plane of the substrate and the central axis of the substrates; and a straight line connecting the central axis of the second nozzle and the center of each of the holes is set in the same direction as the direction of rotation of the substrates and that the angle ranges from 5° to 90° inclusive.

* * * * *